United States Patent [19]
Ura

[11] Patent Number: 6,068,663
[45] Date of Patent: May 30, 2000

[54] DESIGN SUPPORT SYSTEM WITH CIRCUIT DESIGNING DATA EDITING FUNCTION

[75] Inventor: Takanobu Ura, Tokyo, Japan

[73] Assignee: NEC Corporation, Tokyo, Japan

[21] Appl. No.: 08/846,033

[22] Filed: Apr. 25, 1997

[30] Foreign Application Priority Data

Apr. 25, 1996  [JP]  Japan ................................ 8-105243

[51] Int. Cl.[7] ................................................ G06F 17/50
[52] U.S. Cl. .................................................... 716/11
[58] Field of Search ................................ 364/488, 489, 364/490, 491, 578; 395/500.02, 500.12, 500.34, 500.05, 500.19

[56] References Cited

U.S. PATENT DOCUMENTS

| | | | |
|---|---|---|---|
| 4,635,208 | 1/1987 | Coleby et al. | 364/491 |
| 4,831,524 | 5/1989 | Furgerson | 364/300 |
| 4,868,770 | 9/1989 | Smith et al. | 364/578 |
| 5,111,413 | 5/1992 | Lazansky et al. | 364/578 |
| 5,220,512 | 6/1993 | Watkins et al. | 364/489 |
| 5,301,318 | 4/1994 | Mittal | 395/600 |
| 5,418,728 | 5/1995 | Yada | 364/468 |
| 5,528,508 | 6/1996 | Russell et al. | 364/488 |
| 5,856,926 | 1/1999 | Matsumoto et al. | 364/490 |
| 5,867,399 | 2/1999 | Rostoker et al. | 364/489 |

FOREIGN PATENT DOCUMENTS

| | | |
|---|---|---|
| 63-132347 | 6/1988 | Japan . |
| 2-278345 | 11/1990 | Japan . |
| 3-20872 | 1/1991 | Japan . |
| 3-250261 | 11/1991 | Japan . |
| 4-107682 | 4/1992 | Japan . |
| 4-309178 | 10/1992 | Japan . |
| 5-40799 | 2/1993 | Japan . |
| 5-290113 | 11/1993 | Japan . |
| 7-225786 | 9/1995 | Japan . |
| 7-302281 | 11/1995 | Japan . |

Primary Examiner—Paul R. Lintz
Assistant Examiner—Leigh Marie Garbowski
Attorney, Agent, or Firm—Scully, Scott Murphy & Presser

[57] ABSTRACT

A design support system including a data reading unit for reading circuit data for simulation of a circuit to be designed and analyzing and structuring the circuit data to output structured data, a structured circuit data storing unit for storing the structured circuit data output from the input data reading unit, and a circuit data editing unit for extracting and editing arbitrary part of data to be edited from the structured circuit data stored in the structured circuit data storing unit to merge the editing contents with the contents of the structured circuit data stored in the structured circuit data storing unit.

14 Claims, 15 Drawing Sheets

FIG. 6
Fig. 6 A
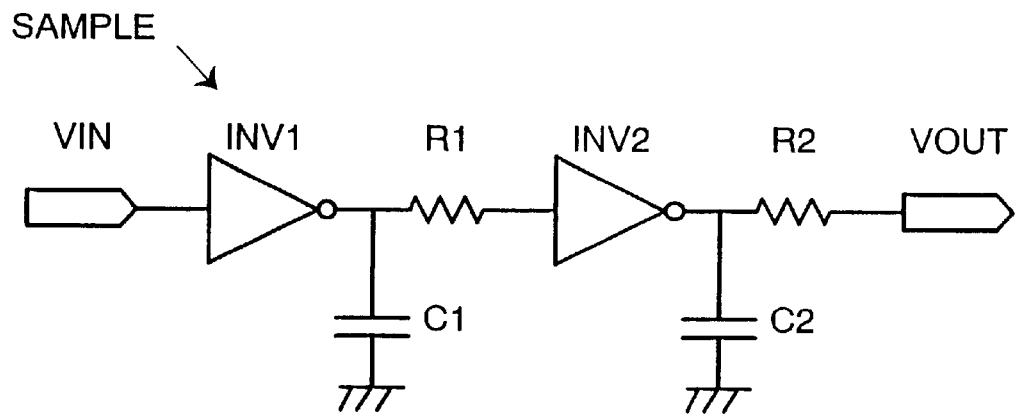
Fig. 6 B
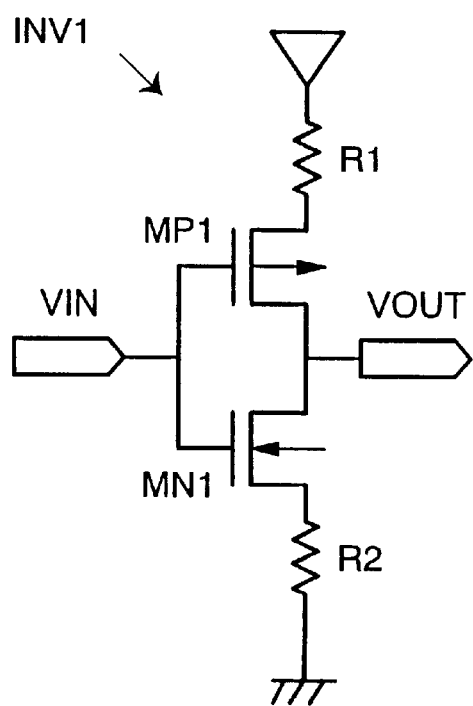
Fig 6 C
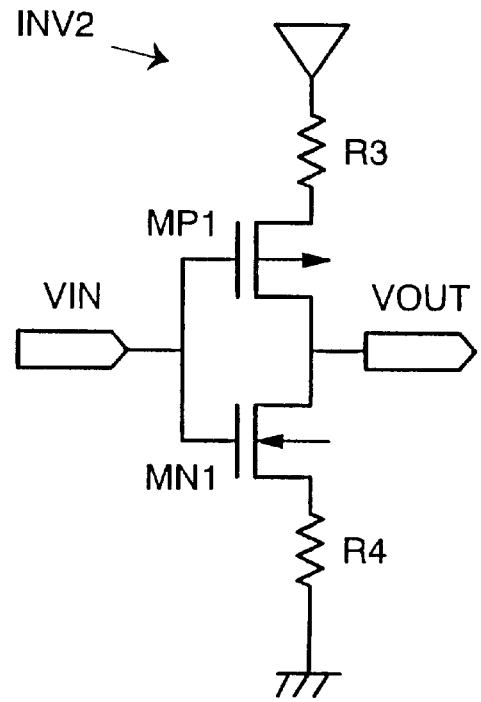

FIG. 7

```
.SUBCKT SAMPLE VIN VOUT

X2   VIN   1      INV1

X2   2     3      INV2

R1   1     2      10

R2   3     VOUT   15

C1   1     0      0.1P

C2   3     0      0.15P

.ENDS SAMPLE

.SUBCKT INV1 VIN VOUT

MP1  1     VIN    VOUT   0    PMOS    L=5U     W=10U

MN1  VOUT  VIN    2      0    NMOS    L=10U    W=15U

R1   VCC   1      100

R2   2     0      120

.ENDS INV2

.SUBCKT INV2 VIN VOUT

MP1  1     VIN    VOUT   0    PMOS    L=7U     W=12U

MN1  VOUT  VIN    2      0    NMOS    L=10U    W=15U

R3   VCC   1      110

R4   2     0      130

.ENDS INV2
```

FIG. 14 (PRIOR ART)
(A)
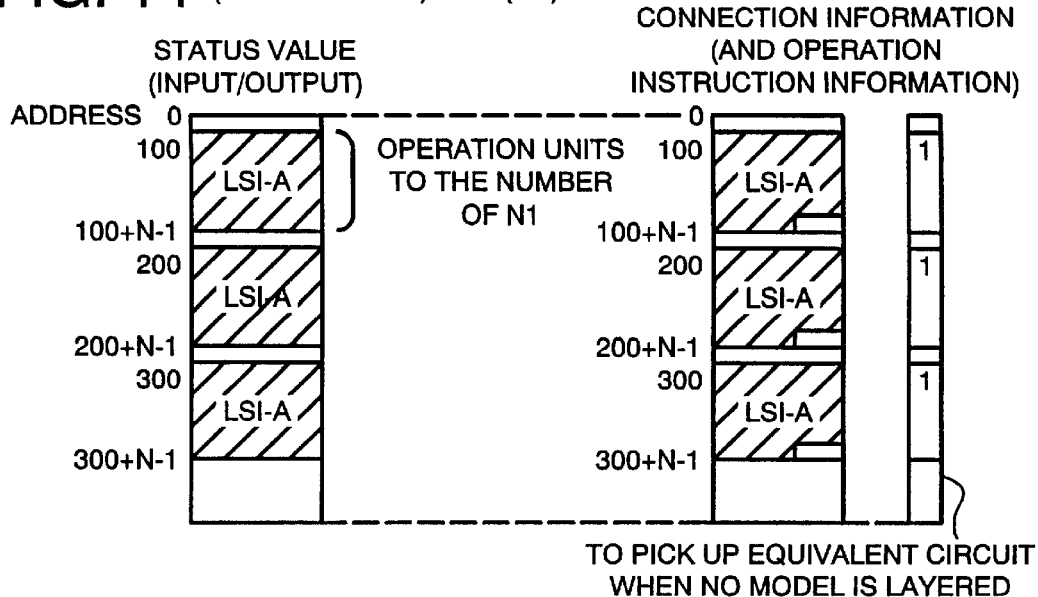
(B)
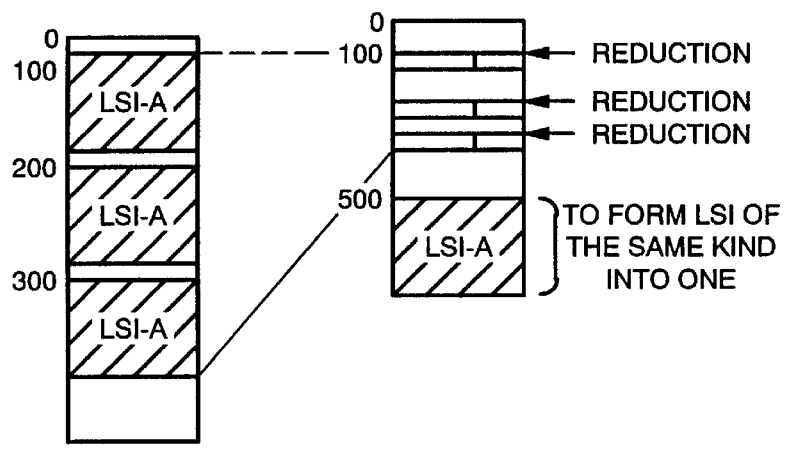
(C)
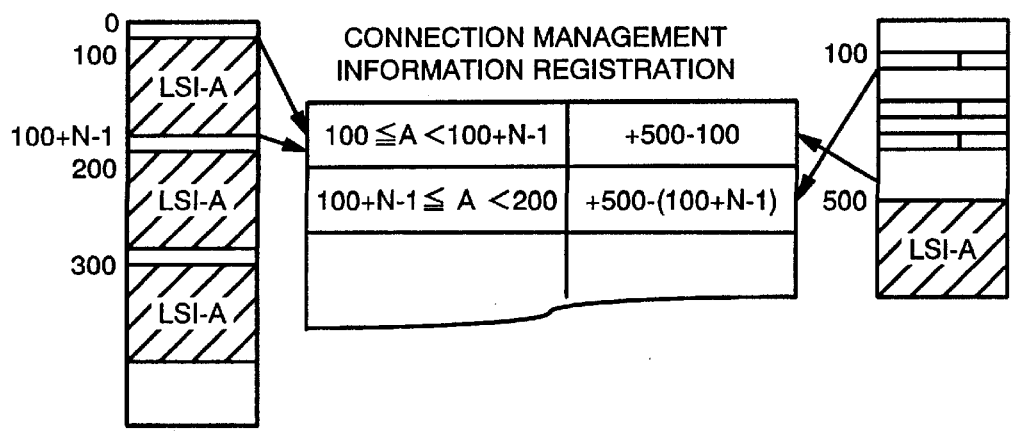

DESIGN SUPPORT SYSTEM WITH CIRCUIT DESIGNING DATA EDITING FUNCTION

BACKGROUND OF THE INVENTION

1. Field of the Invention

The present invention relates to a design support system which conducts circuit simulation in circuit designing and, more particularly, to a design support system having a function of editing and managing circuit designing data for use in circuit simulation.

2. Description of the Related Art

In circuit simulation using a design support system implemented by a computer system, required circuit designing data is obtained by repeating a predetermined procedure including inputting processing of circuit data to be processed, simulation processing and determination processing for determining whether a simulation result meets design specification.

FIG. 10 is a flow chart showing a circuit simulation executing procedure by a conventional design support system. Operation of the conventional circuit simulation will be described with reference to FIG. 10. First, data for simulation is read from a data file (Step 1001) to execute simulation (Step 1002). Then, determination is made whether the simulation result is good or not (Step 1003) and when the simulation result meets circuit specification, all the processing of the circuit simulation is completed. On the contrary, when the simulation result fails to meet the circuit specification, necessary editing and correction is given to the input data (Step 1004) to again execute the simulation (Step 1002). Hereinafter, the circuit simulation is repeatedly conducted until a simulation result meets the circuit specification.

Efficiency of circuit designing has been conventionally improved through automatization of the above-described series of circuit simulation procedures. Conventional art of this kind is recited, for example, in Japanese Patent Laying open (Kokai) No. Heisei 5-40799, entitled "Data Processor". FIG. 11 is a block diagram showing structure of the data processor recited in the literature.

In FIG. 11, an input data editing unit 1102 edits a parameter value of input data 1101 for simulation to take the value as input data. A simulation execution control unit 1104 produces control data for executing simulation as many times as the number of variations of parameters based on the edited input data. A simulation executing unit 1105 executes a designated number of times of simulation based on the control data produced by the simulation execution control unit 1104. A resultant data extracting unit 1110 extracts necessary resultant data from the resultant data (1)–(n) obtained by the simulation by the simulation executing unit 1105. A determination unit 1111 determines whether the resultant data extracted by the resultant data extracting unit 1110 satisfies predetermined conditions or not. A characteristic diagram drawing and displaying unit 1113 draws a characteristic diagram of a circuit based on a determination result obtained by the determination unit 1111 and displays the diagram on a display 1114, as well as causing a characteristic diagram outputting unit 1116 to output a characteristic diagram 1117. A result displaying unit 1115 displays the resultant data extracted by the resultant data extracting unit 1110 on the display 1114.

Other than the automatization of a series of simulation procedures as mentioned above, the above-described conventional design support system can adopt a method of conducting simulation processing and input data editing processing based on user's own decision. Possible technique of conducting processing according to user's decision is employing a circuit simulator (design support system) as an interpreter.

FIG. 12 is a block diagram showing structure of a conventional circuit simulator formed as an interpreter. In FIG. 12, first, according to an input data reading command applied through an input device 1201, data stored in a data file 1202 is accepted as internal data 1208 of an interpreter 1207. Then, according to the command applied from the input device 1201 to the interpreter 1207, a simulation executing unit 1203, a result displaying unit 1204 and an editing/displaying unit 1205 execute simulation processing, simulation result displaying processing and input data editing processing, respectively, using the internal data 1208 of the interpreter 1207.

As described in the foregoing, in a circuit simulator with an input data editing function, data management is extremely important for the purpose of efficiently conducting input data editing processing. In particular, as semiconductor integrated circuits have been increased in scale as objects of circuit configuration, the importance of data management is enhanced. Therefore, various data management techniques have been conventionally proposed. Conventional techniques related to the data management of this kind are, for example, those disclosed in Japanese Patent Laying Open (Kokai) No. Heisei 4-107682, entitled "Logical Simulator" and Japanese Patent Laying Open (Kokai) No. Heisei 3-20872, entitled "Element-Based Management Method in Circuit Synthesis System". In these conventional techniques, data management is conducted in hierarchical structure.

The design support system disclosed in Japanese Patent Laying Open (Kokai) No. Heisei 4-107682 conducts hierarchical management simulation with respect to a party to be connected therewith to reduce processing time for model generation and correction, thereby enabling simulation of a large capacity model. FIG. 13 is a block diagram showing a flow of simulation processing by the design support system recited in this literature.

The design support system shown in FIG. 13 includes a model generating unit 1301 for generating a logic circuit of a model and a simulation executing unit 1305 for executing simulation using a model generated by the model generating unit 1301. The model generating unit 1301 includes a model layering unit 1302 for checking a model structure and converting it into a layered model, a model compressing unit 1303 for compressing layered data, and a connection conversion registering unit 1304 for defining connection conversion rules for the data compressed by the model compressing unit 1303.

FIGS. 14 (A), (B) and (C) are diagrams showing data structure of a model generated at the model generating unit 1301. With reference to these figures, processing by the model generating unit 1301 will be described. First, the model layering unit 1302 checks model structure to layer the data of the model as shown in FIG. 14(A). Then, the model compressing unit 1303 conducts compression processing with respect to the data layered by the model layering unit 1302 by putting equivalent models together on a basis of a layered function as shown in FIG. 14(B). The connection conversion registering unit 1304, as shown in FIG. 14(C), registers connection management information which defines conversion rules for compressed data to maintain a connection relationship. For thus generated model, the simulation executing unit 1305 executes simulation.

The design support system disclosed in Japanese Patent Laying open (Kokai) No. Heisei 3-20872, based on a tree structure position indicated by a first pointer and real circuit element information indicated by a second pointer, manages correspondence of a real circuit element in a circuit being implemented to a functional block in a functional diagram, thereby reducing a required memory capacity. FIG. 15 is a block diagram showing the principle of the data management method by the design support system recited in this literature.

The design support system shown in FIG. 15 includes a hierarchical structure storing unit 1501 for storing a hierarchical structure in a functional diagram as a tree structure, with each element having a first pointer and a second pointer, and a real circuit element information storing unit 1502 for storing information related to an actual circuit element on a functional block basis. Information included in the real circuit element information storing unit 1502 are, for example, page, position and functional block name of an element and a hierarchical block.

When adapted, for example, to a circuit simulator such as a SPICE, the foregoing conventional techniques will be effective in expressing a link between upper and lower hierarchies among blocks and finding from which block a circuit element is generated at the time of development of the hierarchy. In order to find a linkage among circuit elements in the same hierarchy, however, the procedure is necessary of ascending the hierarchy from the circuit element level up to the block level and then descending down to the circuit element level. With a circuit simulator which frequently deals with circuit elements in the same hierarchy, partial editing is impossible.

Another shortcoming is that at the time of manually editing input data, circuit scale will be increased to exceed a capacity which can be dealt by a common editing means, disabling editing processing, or even if editing processing is executable, dealing a large volume of editing data requires enormous time to cause correction errors more frequently.

On the other hand, the conventional art disclosed in Japanese Patent Laying Open (Kokai) No. Heisei 5-40799 automatically edits a varying parameter value to vary the parameter, thereby conducting simulation. Inputting data according to prescribed parameter varying conditions is therefore possible but partial editing of parameters is impossible.

It is also possible to make varying parameters into variables and vary only the variables. With this technique, however, as the circuit is increased in scale, the number of variables is accordingly increased to make seizing of variables of variation difficult.

Moreover, with a circuit simulator employed as an interpreter, since an interpreter in general employing text input manages internal data as character-string data, data input/output processing efficiency is improved, while with respect to such peculiar data as input data for simulation, classification of circuit blocks and description data is difficult and partial editing is accordingly difficult.

SUMMARY OF THE INVENTION

An object of the present invention is to provide a design support system which manages structured circuit data for simulation to enable extraction of part of the circuit data, thereby facilitating partial editing processing in circuit simulation, as well as reducing correction errors in editing processing.

Another object of the present invention is to provide a design support system allowed to conduct partial editing processing in circuit simulation to enable editing of circuit data of a large-scale circuit.

According to one aspect of the invention, a design support system for generating constituent data of a circuit to be designed by circuit simulation in circuit designing, comprises data reading means for reading circuit data for simulation of a circuit to be designed and for analyzing and structuring the circuit data to output structured circuit data, structured circuit data storing means for storing the structured circuit data output form the data reading means, and circuit data editing means for extracting and editing partial data to be edited from the structured circuit data stored in the structured circuit data storing means and for merging edited partial data into the structured circuit data stored in the structured circuit data storing means.

In the preferred construction, the circuit data editing means extracts, as an object of editing, part or all of the structured circuit data stored in the structured circuit data storing means.

In the preferred construction, the data reading means comprises words and phrases/syntax analyzing means for reading the circuit data for simulation and analyzing words and phrases and syntaxes of the circuit data to store analysis results in the structured circuit data storing means, and hierarchical link means for analyzing hierarchical structure of the circuit data stored in the structured circuit data storing means and based on the hierarchical structure obtained as a result of the analysis, adding a hierarchical relationship link pointer indicative of the hierarchical structure to the circuit data stored in the structured circuit data storing means and linking the pointers.

In the preferred construction, the circuit data editing means comprises circuit block/description searching means for searching and extracting a circuit block to be edited or description data in the circuit block from the structured circuit data stored in the structured circuit data storing means, intermediate file outputting means for reading the part of the data detected by the circuit block/description searching means from the structured circuit data storing means to output the data as an intermediate file, editing executing means for executing desired editing processing with respect to the data of the intermediate file output from the intermediate file outputting means to add editing results to the intermediate file, and editing contents merging means for merging, based on the data of the intermediate file edited by the editing executing means, the editing contents with the contents of the circuit data stored in the structured circuit data storing means.

In another preferred construction, the data reading means comprises words and phrases/syntax analyzing means for reading the circuit data for simulation and analyzing words and phrases and syntaxes of the circuit data to store analysis results in the structured circuit data storing means, and hierarchical link means for analyzing hierarchical structure of the circuit data stored in the structured circuit data storing means and based on the hierarchical structure obtained as a result of the analysis, adding a hierarchical relationship link pointer indicative of the hierarchical structure to the circuit data stored in the structured circuit data storing means and linking the pointers, and the circuit data editing means comprises circuit block/ description searching means for searching and extracting a circuit block to be edited or description data in the circuit block from of the structured circuit data stored in the structured circuit data storing means, intermediate file outputting means for reading the part of the data detected by the circuit block/description searching means from the structured circuit data storing means to output the data as an intermediate file, editing executing means for executing desired editing processing with respect to the data of the intermediate file output from the intermediate file outputting means to add editing results to the intermediate file, and editing contents merging means for merging, based on the data of the intermediate file edited by the editing executing means, the editing contents with the contents of the circuit data stored in the structured circuit data storing means.

In another preferred construction, the structured circuit data storing means comprises a circuit block table for managing a circuit block in the circuit data structured by the data reading means, a description data table for classifying and managing description data existing in each the circuit blocks in kinds, and a description leading pointer management table for storing and managing a pointer indicative of a leading address of the description data table.

In the above-mentioned construction, the data reading means comprises words and phrases/syntax analyzing means for reading the circuit data for simulation and analyzing words and phrases and syntaxes of the circuit data to store analysis results in the structured circuit data storing means, and hierarchical link means for analyzing hierarchical structure of the circuit data stored in the structured circuit data storing means and based on the hierarchical structure obtained as a result of the analysis, adding a hierarchical relationship link pointer indicative of the hierarchical structure to the circuit data stored in the structured circuit data storing means and linking the pointers, and the structured circuit data storing means comprises a circuit block table for managing a circuit block in the circuit data structured by the words and phrases/syntax analyzing means of the data reading means, a description data table for classifying and managing description data existing in each the circuit blocks in kinds, and a description leading pointer management table for storing and managing a pointer indicative of a leading address of the description data table, and the circuit data editing means comprises circuit block/ description searching means for searching and extracting a circuit block to be edited or description data in the circuit block from the structured circuit data stored in the structured circuit data storing means, intermediate file outputting means for reading the part of the data detected by the circuit block/description searching means from the structured circuit data storing means to output the data as an intermediate file, editing executing means for executing desired editing processing with respect to the data of the intermediate file output from the intermediate file outputting means to add editing results to the intermediate file, and editing contents merging means for merging, based on the data of the intermediate file edited by the editing executing means, the editing contents with the contents of the circuit data stored in the structured circuit data storing means.

In the above-mentioned construction, the structured circuit data storing means comprises a circuit block table for managing a circuit block in the circuit data structured by the data reading means, a description data table for classifying and managing description data existing in each the circuit blocks in kinds, and a description leading pointer management table for storing and managing a pointer indicative of a leading address of the description data table, the circuit block table stores a circuit block list link pointer for the linkage to other the circuit block tables, and a description leading pointer management table leading pointer indicative of a leading address of the description leading pointer management table.

In another preferred construction, the structured circuit data storing means comprises a circuit block table for managing a circuit block in the circuit data structured by the data reading means, a description data table for classifying and managing description data existing in each the circuit blocks in kinds, and a description leading pointer management table for storing and managing a pointer indicative of a leading address of the description data table, the description data table stores the circuit description contents in the circuit block of the circuit data, and a description data table link pointer indicative of a leading address of a subsequent description data table or a hierarchical relationship link pointer indicative of a circuit block table of a lower hierarchy circuit block.

In another preferred construction, the structured circuit data storing means comprises a circuit block table for managing a circuit block in the circuit data structured by the data reading means, a description data table for classifying and managing description data existing in each the circuit blocks in kinds, and a description leading pointer management table for storing and managing a pointer indicative of a leading address of the description data table, the circuit block table stores a circuit block list link pointer for the linkage to other the circuit block tables, and a description leading pointer management table leading pointer indicative of a leading address of the description leading pointer management table, and the description data table stores the circuit description contents in the circuit block of the circuit data, and a description data table link pointer indicative of a leading address of a subsequent description data table or a hierarchical relationship link pointer indicative of a circuit block table of a lower hierarchy circuit block.

Also, the structured circuit data storing means comprises a circuit block table for managing a circuit block in the circuit data structured by the data reading means, a hash table for managing the circuit block table, a description data table for classifying and managing description data existing in each the circuit blocks in kinds, and a description leading pointer management table for storing and managing a pointer indicative of a leading address of the description data table, the circuit block table stores a circuit block list link pointer for the linkage to other the circuit block tables, and a description leading pointer management table leading pointer indicative of a leading address of the description leading pointer management table, and the hash table manages the description leading pointer management table leading pointer included in the circuit block table.

Also, the structured circuit data storing means comprises a circuit block table for managing a circuit block in the circuit data structured by the data reading means, a hash table for managing the circuit block table, a description data table for classifying and managing description data existing in each the circuit blocks in kinds, and a description leading pointer management table for storing and managing a pointer indicative of a leading address of the description data table, the circuit block table stores a circuit block list link pointer for the linkage to other the circuit block tables, and a description leading pointer management table leading pointer indicative of a leading address of the description leading pointer management table, the description data table stores the circuit description contents in the circuit block of the circuit data, and a description data table link pointer indicative of a leading address of a subsequent description data table or a hierarchical relationship link pointer indicative of a circuit block table of a lower hierarchy circuit block, and wherein the hash table manages the description leading pointer management table leading pointer included in the circuit block table.

According to another aspect of the invention, a design support system for generating constituent data of a circuit to be designed by circuit simulation in circuit designing, comprises data file storing means for storing circuit data for simulation of a circuit to be designed, data reading means for reading circuit data for simulation from the data file storing means and analyzing and structuring the circuit data to output structured circuit data, structured circuit data storing means for storing structured circuit data output by the data reading means, circuit data editing means for extracting and editing partial data to be edited from structured circuit data stored in the structured circuit data storing means and merging edited partial data into the contents of the structured circuit data stored in the structured circuit data storing means, simulation executing means for reading structured circuit data from the structured circuit data storing means to execute simulation, and output means for outputting a simulation result obtained by the simulation executing means.

In the above-mentioned construction, the design support system further comprises input means for receiving input of a predetermined command, wherein the input data reading means, the circuit data editing means, the simulation executing means and the output means are formed as an interpreter so as to operate according to a command applied through the input means.

In the above-mentioned construction, the circuit data editing means arbitrarily extracts, as an object of editing, part or all of the structured circuit data stored in the structured circuit data storing means.

In the preferred construction, the data reading means comprises words and phrases/syntax analyzing means for reading the circuit data for simulation and analyzing words and phrases and syntaxes of the circuit data to store analysis results in the structured circuit data storing means, and hierarchical link means for analyzing hierarchical structure of the circuit data stored in the structured circuit data storing means and based on the hierarchical structure obtained as a result of the analysis, adding a hierarchical relationship link pointer indicative of the hierarchical structure to the circuit data stored in the structured circuit data storing means and linking the pointers, and the circuit data editing means comprises circuit block/ description searching means for searching and extracting a circuit block to be edited or description data in the circuit block from the structured circuit data stored in the structured circuit data storing means, intermediate file outputting means for reading the part of the data detected by the circuit block/description searching means from the structured circuit data storing means to output the data as an intermediate file, editing executing means for executing desired editing processing with respect to the data of the intermediate file output from the intermediate file outputting means to add editing results to the intermediate file, and editing contents merging means for merging, based on the data of the intermediate file edited by the editing executing means, the editing contents with the contents of the circuit data stored in the structured circuit data storing means.

In the preferred construction, the structured circuit data storing means comprises a circuit block table for managing a circuit block in the circuit data structured by the data reading means, a description data table for classifying and managing description data existing in each the circuit blocks in kinds, and a description leading pointer management table for storing and managing a pointer indicative of a leading address of the description data table.

In another preferred construction, the structured circuit data storing means comprises a circuit block table for managing a circuit block in the circuit data structured by the data reading means, a description data table for classifying and managing description data existing in each the circuit blocks in kinds, and a description leading pointer management table for storing and managing a pointer indicative of a leading address of the description data table, wherein the circuit block table stores a circuit block list link pointer for the linkage to other the circuit block tables, and a description leading pointer management table leading pointer indicative of a leading address of the description leading pointer management table, and wherein the description data table stores the circuit description contents in the circuit block of the circuit data, and a description data table link pointer indicative of a leading address of a subsequent description data table or a hierarchical relationship link pointer indicative of a circuit block table of a lower hierarchy circuit block.

Also, the structured circuit data storing means comprises a circuit block table for managing a circuit block in the circuit data structured by the data reading means, a hash table for managing the circuit block table, a description data table for classifying and managing description data existing in each the circuit blocks in kinds, and a description leading pointer management table for storing and managing a pointer indicative of a leading address of the description data table, wherein the circuit block table stores a circuit block list link pointer for the linkage to other the circuit block tables, and a description leading pointer management table leading pointer indicative of a leading address of the description leading pointer management table, and the hash table manages the description leading pointer management table leading pointer included in the circuit block table.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 6 (A) is a circuit diagram showing an example of a circuit as an object of processing and showing structure of "SAMPLE".

FIG. 6 (B) is a circuit diagram showing an example of a circuit as an object of processing and showing structure of "INV1".

FIG. 6 (C) is a circuit diagram showing an example of a circuit as an object of processing and showing structure of "INV2".

FIG. 7 is a diagram showing an example of circuit data corresponding to the circuit diagram of FIG. 6.

FIG. 14 is a diagram showing data structure of a model generated by a model generating unit of FIG. 13.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
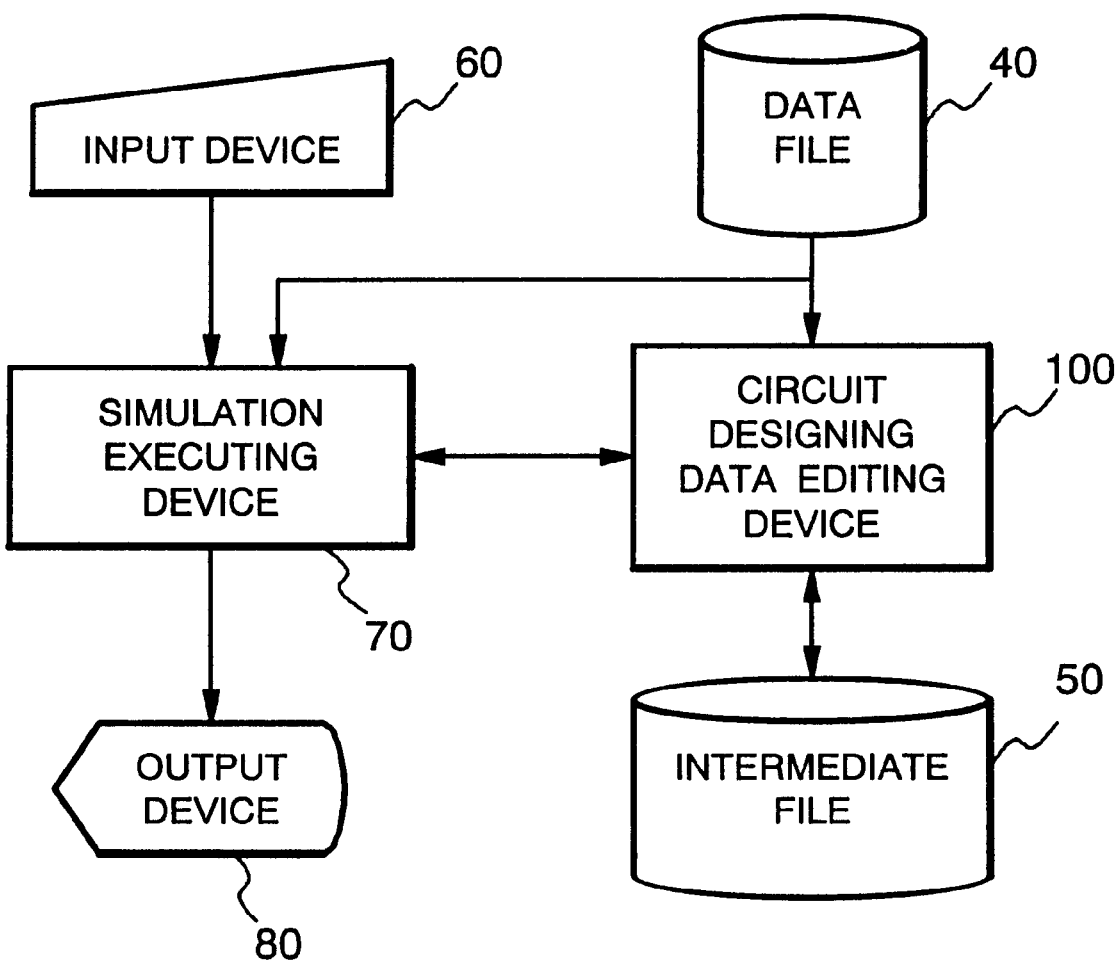
FIG. 1 is a block diagram showing structure of a design support system according to one embodiment of the present invention.

FIG. 1 is a block diagram showing structure of a design support system according to one embodiment of the present invention.

As illustrated in FIG. 1, the design support system of the present embodiment includes a data file 40 which stores circuit data as an object of circuit simulation, an input device 60 for receiving input of predetermined command and data, a circuit designing data editing device 100 for reading circuit data from the data file 40 to conduct editing processing, an intermediate file 50 for storing circuit data edited by the circuit designing data editing device 100, a simulation executing device 70 for reading circuit data from the data file 40 or the intermediate file 50 to execute simulation processing, and an output device 80 for outputting a simulation result obtained by the simulation executing device 70.

Figure 2:
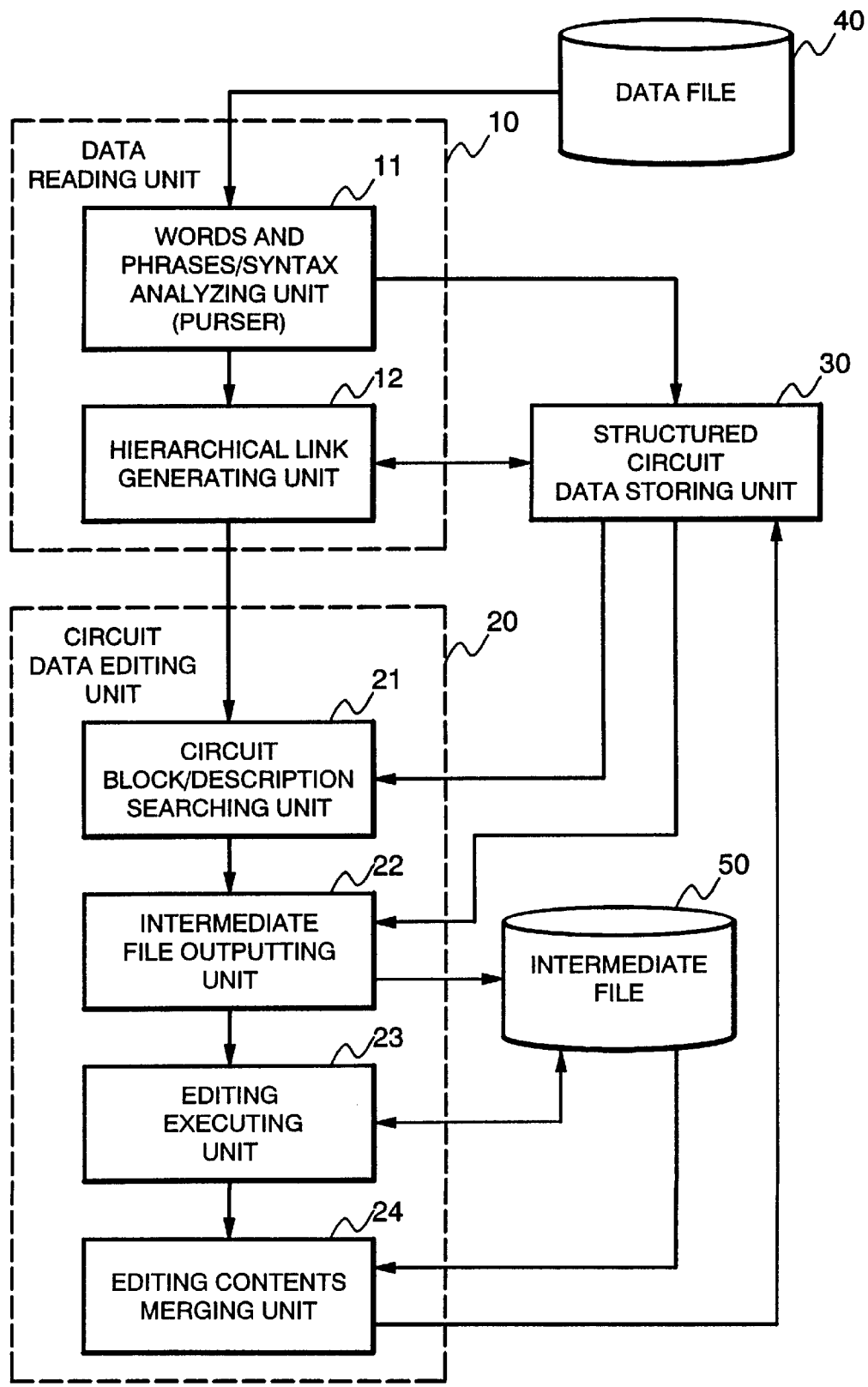
FIG. 2 is a block diagram showing structure of a circuit designing data editing device of the present embodiment.

FIG. 2 is a block diagram showing structure of the circuit designing data editing device 100, which is a representative structure of the present embodiment.

As illustrated in FIG. 2, the circuit designing data editing device 100 includes a data reading unit 10 for reading and analyzing circuit data from the data file 40, a structured circuit data storing unit 30 for storing the circuit data analyzed and structured by the data reading unit 10, and a circuit data editing unit 20 for reading the structured circuit data stored in the structured circuit data storing unit 30, conducting editing processing with respect to the circuit data and storing the data in the intermediate file 50.

In the above-described architecture, the data reading unit 10 and the circuit data editing unit 20 are implemented, for example, by program-controlled CPU and RAM or other memory. The structured circuit data storing unit 30 is implemented, for example, by a magnetic disk device or other storage device. Computer program for controlling the data reading unit 10 and the circuit data editing unit 20 is presented as being stored in a storage medium such as a magnetic disk or a semiconductor memory.

The data reading unit 10 includes a words and phrases/syntax analyzing unit 11 for analyzing structure and description contents of circuit data read from the data file 40 and a hierarchical link generating unit 12 for adding a pointer indicative of hierarchical structure to the circuit data subjected to the analysis processing by the words and phrases/syntax analyzing unit 11 to link the data.

The circuit data editing unit 20 includes a circuit block/description searching unit 21 for searching a circuit block and description to be edited from circuit data stored in the structured circuit data storing unit 30, an intermediate file outputting unit 22 for storing the data detected by the circuit block/description searching unit 21 in the intermediate file 50, an editing executing unit 23 for reading and editing circuit data as an object of editing from the intermediate file 50, and an contents merging unit 24 for merging the contents of editing by the editing executing unit 23 with the storage contents of the structured circuit data storing unit 30.

Figure 3:
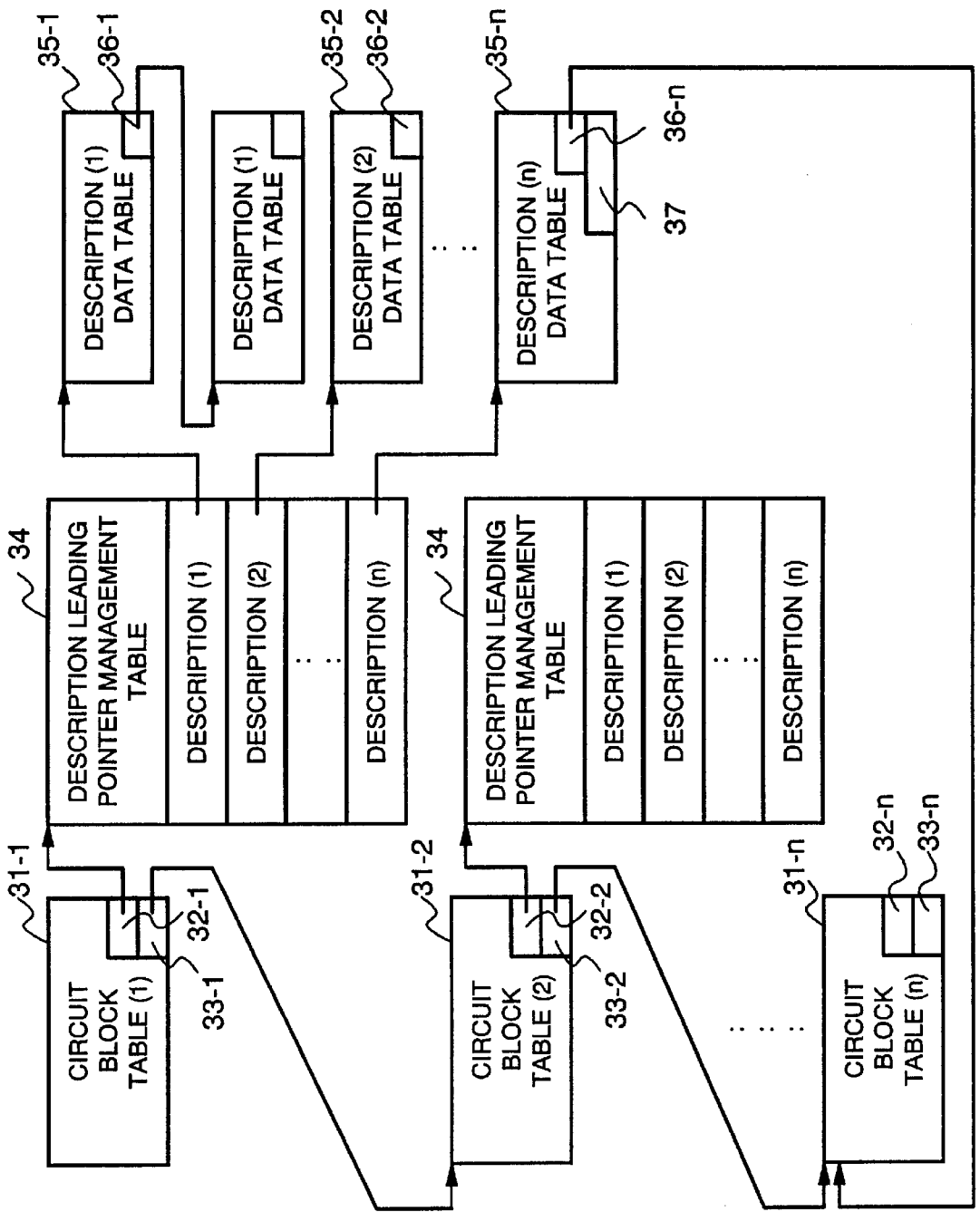
FIG. 3 is a diagram showing an example of structure of an internal storage region in a structured circuit data storing unit according to the present embodiment.

FIG. 3 is an explanatory diagram showing structure of an internal storage region of the structured circuit data storing unit 30 in the present embodiment.

With reference to FIG. 3, the internal storage region of the structured circuit data storing unit 30 has a hierarchical structure and includes a circuit block table 31 for managing a circuit block existing in circuit data as an object of processing, a description leading pointer management table 34 corresponding to the circuit block table 31, and a description data table 35 corresponding to description information registered at the description leading pointer management table 34. In the following description, in a case of the necessity for discriminating each of a plurality of tables provided, the table numbers are subscripted as, for example, circuit block table 31-1 and description leading pointer management table 34-2. When there is no need of distinguishing tables of the same kind in particular, the tables are numbered without subscript.

The circuit block tables 31 are provided to the number of n corresponding to the number of circuit blocks existing in circuit data. Each circuit block table 31 stores, in addition to the description leading pointer management table 34 and the description data table 35, a pointer 32 linked with its corresponding description leading pointer management table 34 and a circuit block list pointer 33 representing other circuit block table 31 by a list structure.

The description leading pointer management tables 34 are provided to the number of n corresponding to the circuit block tables 31 and each table 34 stores m description information (element description). The description information to the number of m is each correlated and linked with one or a plurality of description data tables 35.

The description data tables 35 are provided corresponding to the description information stored in the description leading pointer management tables 34. In FIG. 3, a plurality of description data tables may be correlated in series with the description information like the description data table 35-1 corresponding to the description (1) of the description leading pointer management table 34-1. Each description data table 35 stores a data description region of its corresponding description information and a description data table link pointer 36 indicative of a description data table 35 corresponding to the subsequent description information. In addition, the description data table 35-m corresponding to the description (m) of the description leading pointer management table 34 stores a hierarchical relationship link pointer 37 indicative of a circuit block of a further lower hierarchy. Thus linking an arbitrary description data table 35 to the circuit block table 31 results in representing a hierarchical structure.

Figure 4:
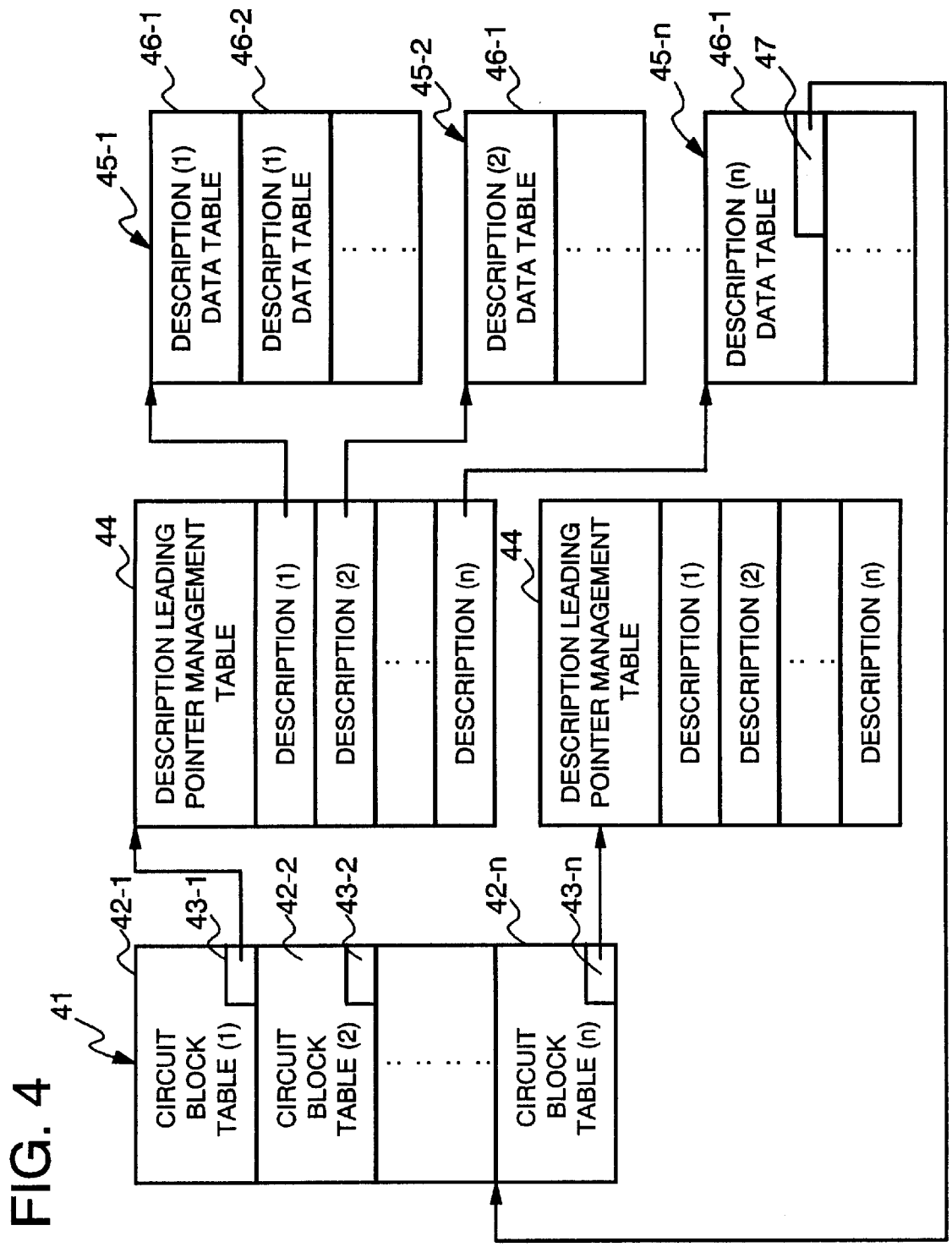
FIG. 4 is a diagram showing an example of structure of an internal storage region in a structured circuit data storing unit in a case where binary search is employed for the search of the structured circuit data storing unit.

FIG. 4 is an explanatory diagram showing structure of the internal storage region of the structured circuit data storing unit 30 in a case where binary search is employed in searching data stored in the structured circuit data storing unit 30.

With reference to FIG. 4, the internal storage region of the structured circuit data storing unit 30 has a hierarchical structure and includes a circuit block table array 41 for managing a circuit block existing in circuit data as an object of processing, a description leading pointer management table 44 corresponding to the circuit block table array 41, and a description data table array 45 corresponding to description information registered at the description leading pointer management table 44. In the following description, in a case of the necessity for discriminating each of a plurality of tables provided, the table numbers are subscripted. When there is no need to distinguish tables of the same kind in particular, the tables are numbered without subscript.

The circuit block table array 41 is composed of circuit block tables 42, which are provided to the number of n corresponding to circuit blocks existing in circuit data. Each circuit block table 42 stores, in addition to the description leading pointer management table 44 and the description data table 45, a pointer 43 linked to its corresponding description leading pointer management table 44.

The description leading pointer management tables 44 are provided to the number of n corresponding to n circuit block tables 42 of the circuit block table array 41 and each table 44 stores m description information (element description). The description information to the number of m is each correlated and linked with one description data table array 45.

The description data table array 45 is provided corresponding to the description information stored in the description leading pointer management table 44. In other words, the description data table arrays 45 are provided to the number of m for each description leading pointer management table 44. Each description data table array 45 is composed of a plurality of description data tables 46. The m-th description data table array 45m corresponding to the description (m) of the description leading pointer management table 44 stores a hierarchical relationship link pointer 47 indicative of a circuit block of a lower hierarchy.

Figure 5:
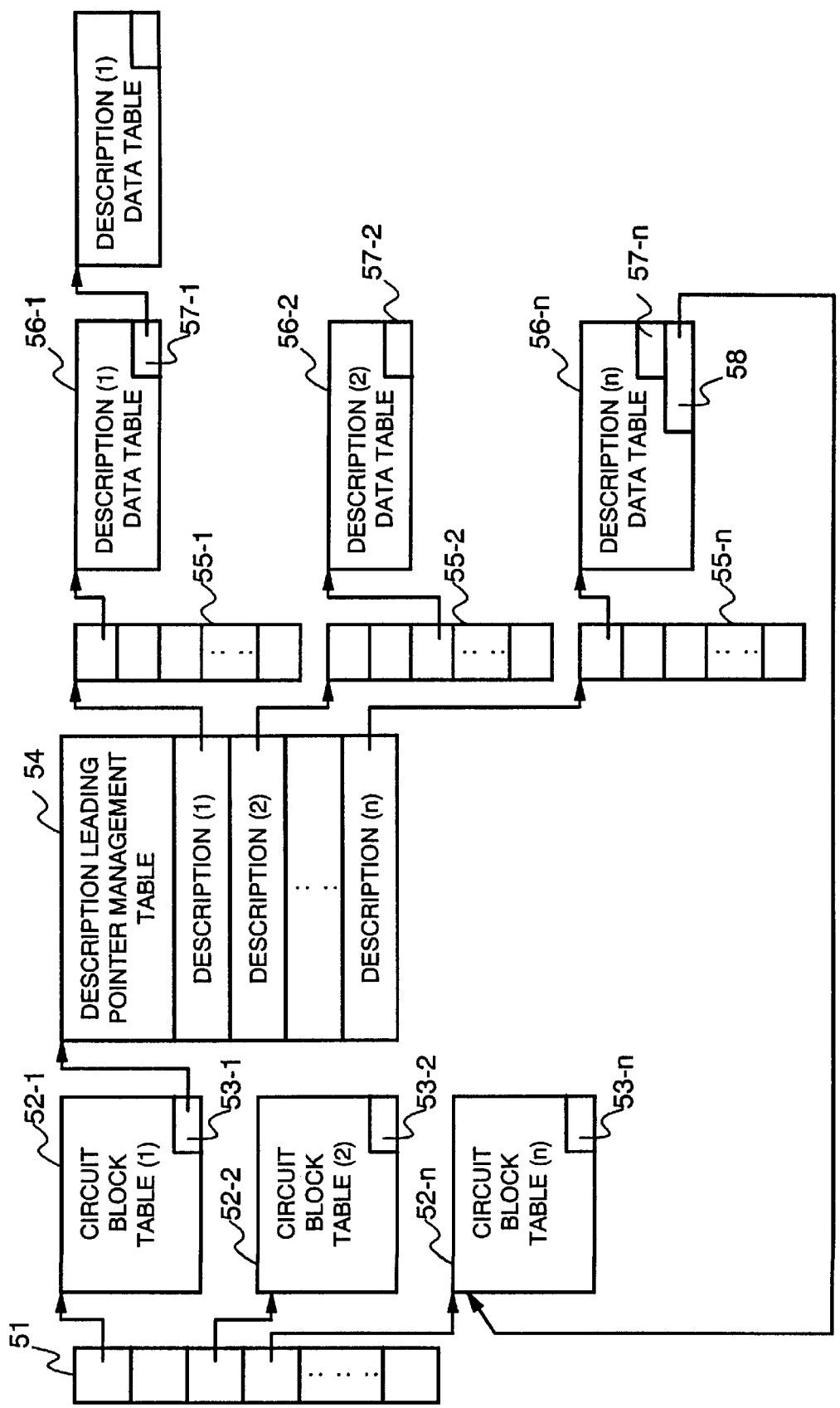
FIG. 5 is a diagram showing an example of structure of an internal storage region in a structured circuit data storing unit in a case where hash search is employed for the search of the structured circuit data storing unit.

FIG. 5 is an explanatory diagram showing structure of the internal storage region of the structured circuit data storing unit 30 in a case where hash search is employed in searching data stored in the structured circuit data storing unit 30.

With reference to FIG. 5, the internal storage region of the structured circuit data storing unit 30 has a hierarchical structure and includes a circuit block hash table 51 and a circuit block table array 52 for managing a circuit block existing in circuit data as an object of processing, a description leading pointer management table 54 corresponding to the circuit block table array 52, and a description hash table 55 and a description data table array 56 corresponding to the description information registered at the description leading pointer management table 54. In the following description, in a case of the necessity of discriminating each of a plurality of tables provided, table numbers are subscripted. When there is no need of distinguishing tables of the same kind in particular, the tables are numbered without subscript.

The circuit block tables 52 are provided to the number of n corresponding to the number of circuit blocks existing in circuit data and each block table is managed by the circuit block hash table 51. Each circuit block table 52 stores, in addition to the description leading pointer management table 54 and the description data table 56, a pointer 53 linked with its corresponding description leading pointer management table 54. With the circuit block table 52 being managed by the circuit block hash table 51, searching a target circuit block table 52 can be directly conducted from the circuit block hash table 51. It is therefore unnecessary to store, in each circuit block table 52, a circuit block list pointer representing other circuit block table 52 by a list structure.

The description leading pointer management tables 54 are provided to the number of n corresponding to the circuit block tables 52 and each table 54 stores m description information (element description). The description information to the number of m is each correlated and linked with the description hash table 55 which manages the description data table 56.

The description data tables 56 are provided corresponding to the description information stored in the description leading pointer management table 54 and managed by the description hash table 55. In FIG. 5, a plurality of description data tables may be provided in series corresponding to the description information, like the description data table 56-1 corresponding to the description (1) of the description leading pointer management table 54. Each description data table 56 stores a data description region of its corresponding description information and a description data table link pointer 57 indicative of a description data table 56 corresponding to the subsequent description information. In addition, the description data table 56-m corresponding to the description (m) of the description leading pointer management table 54 stores a hierarchical relationship link pointer 58 indicative of a circuit block of a further lower hierarchy. With the description data table 56 being managed by the description hash table 55, searching a target description data table 56 can be directly conducted from the description hash table 55.

Operation of circuit data editing processing by the design support system of the present embodiment will be described.

First, the words and phrases/syntax analyzing unit 11 in the data reading unit 10 reads circuit data for simulation stored in the data file 40 to analyze structure and description contents of the circuit data and structure the data. Then, the unit 11 stores the structured circuit data including a circuit block table, a description leading pointer management table and a description data table in the structured circuit data storing unit 30.

The hierarchical link generating unit 12 then reads the structured circuit data stored in the structured circuit data storing unit 30, links hierarchical relationship link pointers of the circuit data in question to set up such a hierarchical structure as shown in FIGS. 3 to 5, and again stores the structured data in the structured circuit data storing unit 30.

Next, the circuit block/description searching unit 21 in the circuit data editing unit 20 searches and reads a circuit block to be edited or description data in the circuit block. The intermediate file outputting unit 22 then stores the description data read by the circuit block/description searching unit 21 in the intermediate file 50 as partial data of the circuit data in question.

The editing executing unit 23 then reads the data stored in the intermediate file 50 and initiates an editor to conduct editing processing with respect to the data in question. The unit 23 then stores the editing contents in the intermediate file 50.

The editing merging unit 24 then reads the contents of the editing by the editing executing unit 23 stored in the intermediate file 50 and merges the contents with the circuit data stored in the structured circuit data storing unit 30.

Circuit data is thus structured, while extraction and editing of part of the circuit data in question is executed as necessary.

Figure 8:
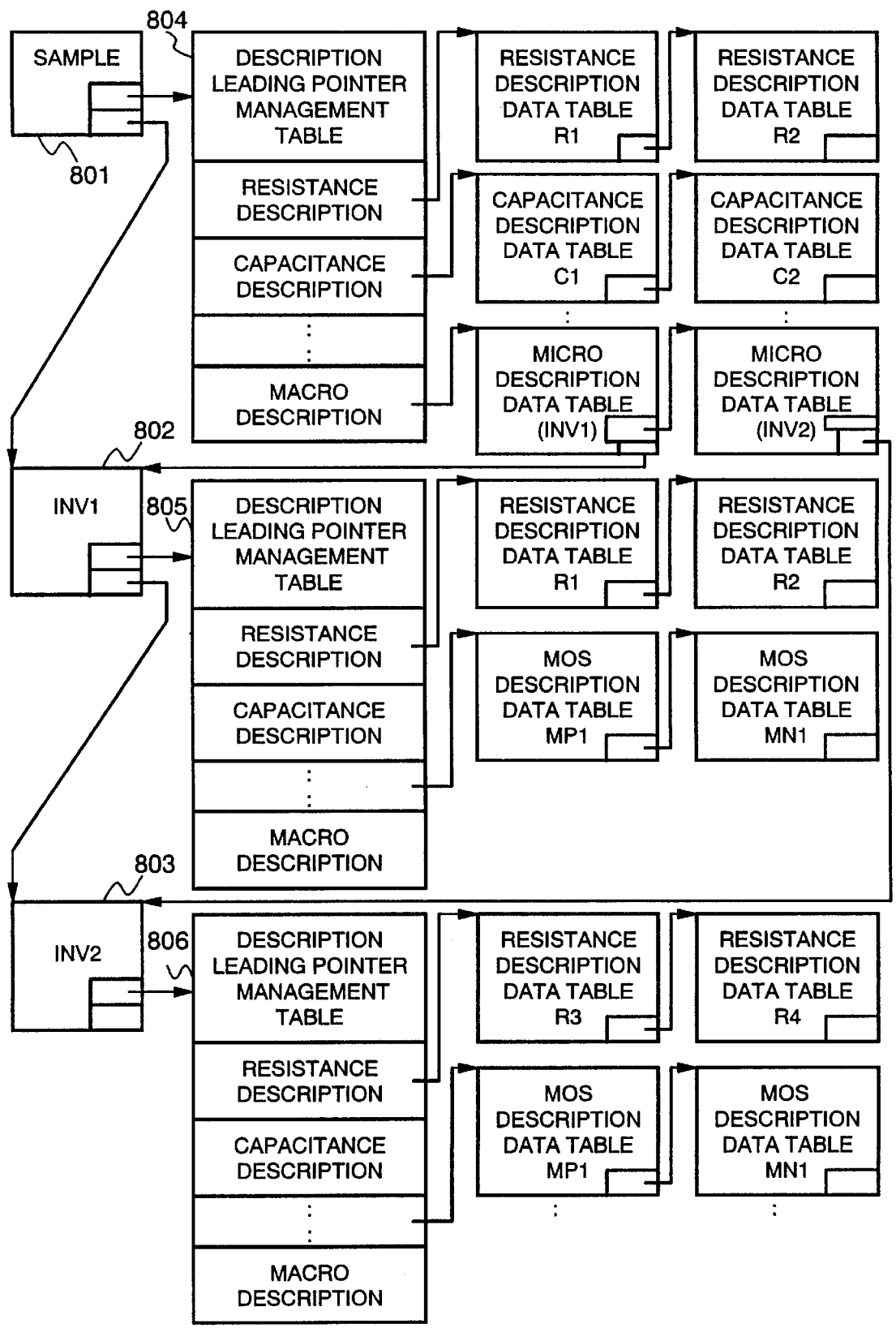
FIG. 8 is a diagram showing structure of an internal storage region of a structured circuit data storing unit which stores the circuit data illustrated in FIGS. 6 and 7.

Operation of the present embodiment will be described with reference to concrete examples of circuit data shown in FIGS. 6 to 8.

FIG. 6 is a circuit diagram of a source of circuit data as an object of processing. FIG. 6(A) is a circuit diagram of a target circuit. The circuit diagrams (B) and (C) show concrete structures of inverters "INV1" and "INV2" constituting "SAMPLE" illustrated in the circuit diagram (A), respectively. FIG. 7 is circuit description (SPICE net list) of the circuit diagram illustrated in FIG. 6. FIG. 8 is a diagram showing an example of a storage region in the structured circuit data storing unit 30 in a case where the circuit data illustrated in FIGS. 6 and 7 is structured.

Under the initial state, the circuit description of FIG. 7 is stored in the data file 40 as circuit data as an object of processing. The words and phrases/syntax analyzing unit 11 of the data reading unit 10 first reads the circuit block definition description ". SUBCKT SAMPLE" stored in the data file 40 to analyze words and phrases and syntaxes. Then, the unit 11 forms a circuit block table 801 (SAMPLE) of FIG. 8 and then a description leading pointer management table 804 for the circuit block in question. Then, the unit 11 reads element descriptions to form a "resistance description data table (R1)", a "capacitance description data table (C1)" and a "macro description data table (X1(INV1))" as the description data tables corresponding to the descriptions of the respective elements. When in further reading descriptions of the same kind with respect to the circuit block in question, a "resistance description data table (R2)", a "capacitance description data table (C2)" and a "macro description data table (X2 (INV2))" are newly formed as the description data tables corresponding to these descriptions. The newly formed description data tables are linked to the end of the description data tables for the descriptions of the same kind which are formed immediately prior thereto. As a result, a plurality of description data tables corresponding to the descriptions of the same kind are linked one after another. The above-described resistances R1 and R2, capacitances C1 and C2 and inverters INV2 and INV2 are the elements shown in "SAMPLE" of the circuit diagram (A) of FIG. 6.

Next, the words and phrases/syntax analyzing unit 11 reads the circuit block definition description ".SUBCKT INV1" to analyze words and phrases and syntaxes. The unit 11 then forms a circuit block table 802 (INV1) of FIG. 8 and then a description leading pointer management table 805 for the circuit block in question. The unit 11 then reads element descriptions of the circuit block table 802 to form description data tables corresponding to the descriptions. The unit 11 then links the formed description data tables with the description leading pointer management table 805.

Next, also with respect to the circuit block definition description ".SUBCKT INV2", the unit 11 forms a circuit block table 803 (INV2) and a description leading pointer management table 806 and then description data tables corresponding to element descriptions and links the respective tables.

After reading of all the data is completed in the foregoing manner, the hierarchical link generating unit 12 links a hierarchical relationship link pointer indicative of a hierarchical relationship in each circuit block table with the corresponding circuit block table. As a result, a hierarchical structure is expressed, in which the circuit data shown in FIGS. 6 and 7 is all classified and structured on a circuit block basis and a description basis.

Next, editing of thus structured data contents stored in the structured circuit data storing unit 30 is conducted. When the circuit block table 802 (INV1) and all the resistance descriptions are designated at the time of editing processing, the circuit data editing unit 20 refers to the structured data in the structured circuit data storing unit 30 to search the designated circuit block table 802 (INV1) The unit 20 also refers to the description leading pointer management table 805 corresponding to the circuit block table 802 to search a leading pointer of the resistance description. Then, by sequentially tracing a pointer indicative of subsequent data from the leading pointer, the unit 20 extracts data related to all the resistances (R1 and R2 shown in the circuit diagram (B) of FIG. 6). The unit 20 then searches a leading pointer of the MOS description of the description leading pointer management table 805 to extract data related to all the MOS transistors (MP1 and MN1 shown in the circuit diagram (B) of FIG. 6). Editing based on these extracted data enables the circuit data shown in FIGS. 6 and 7 to be partially edited.

Description will be next made of an example in which the foregoing flow of processing is applied to a circuit simulator formed as an interpreter.

Figure 9:
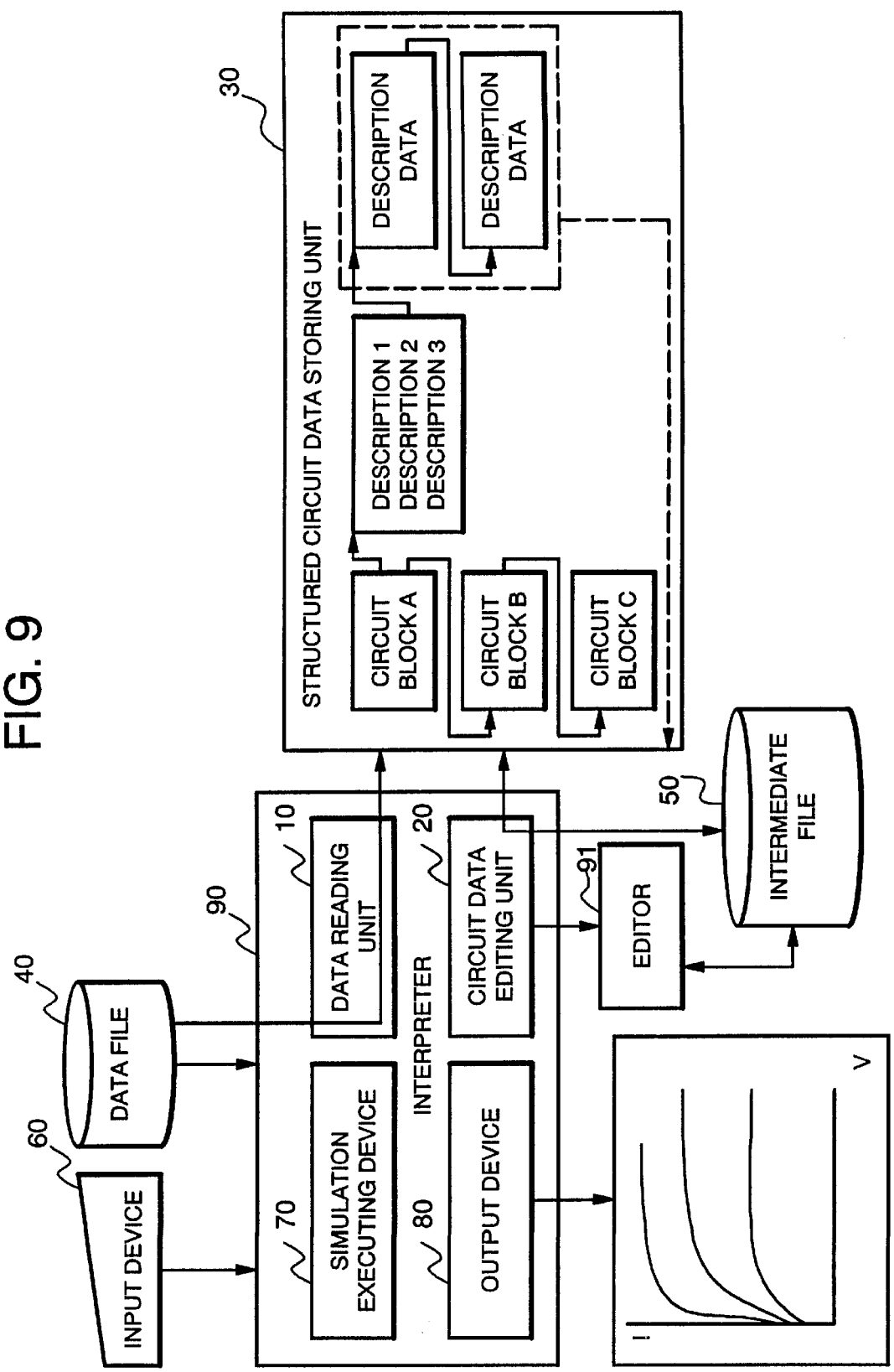
FIG. 9 is a block diagram showing structure of a design support system of the present invention adapted as a circuit simulator formed as an interpreter.
Figure 10:
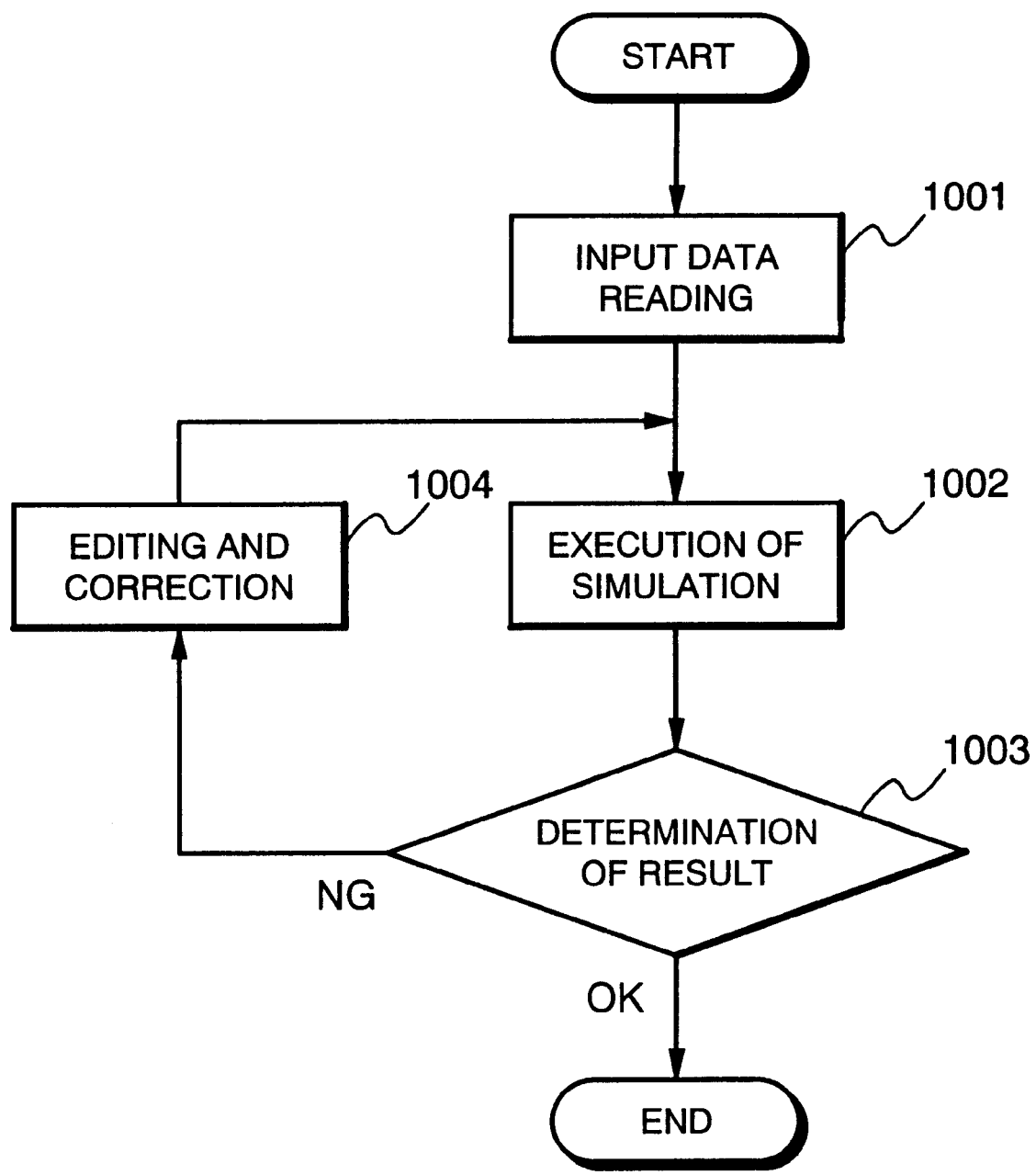
FIG. 10 is a flow chart showing a circuit simulation executing procedure by a conventional design support system.
Figure 11:
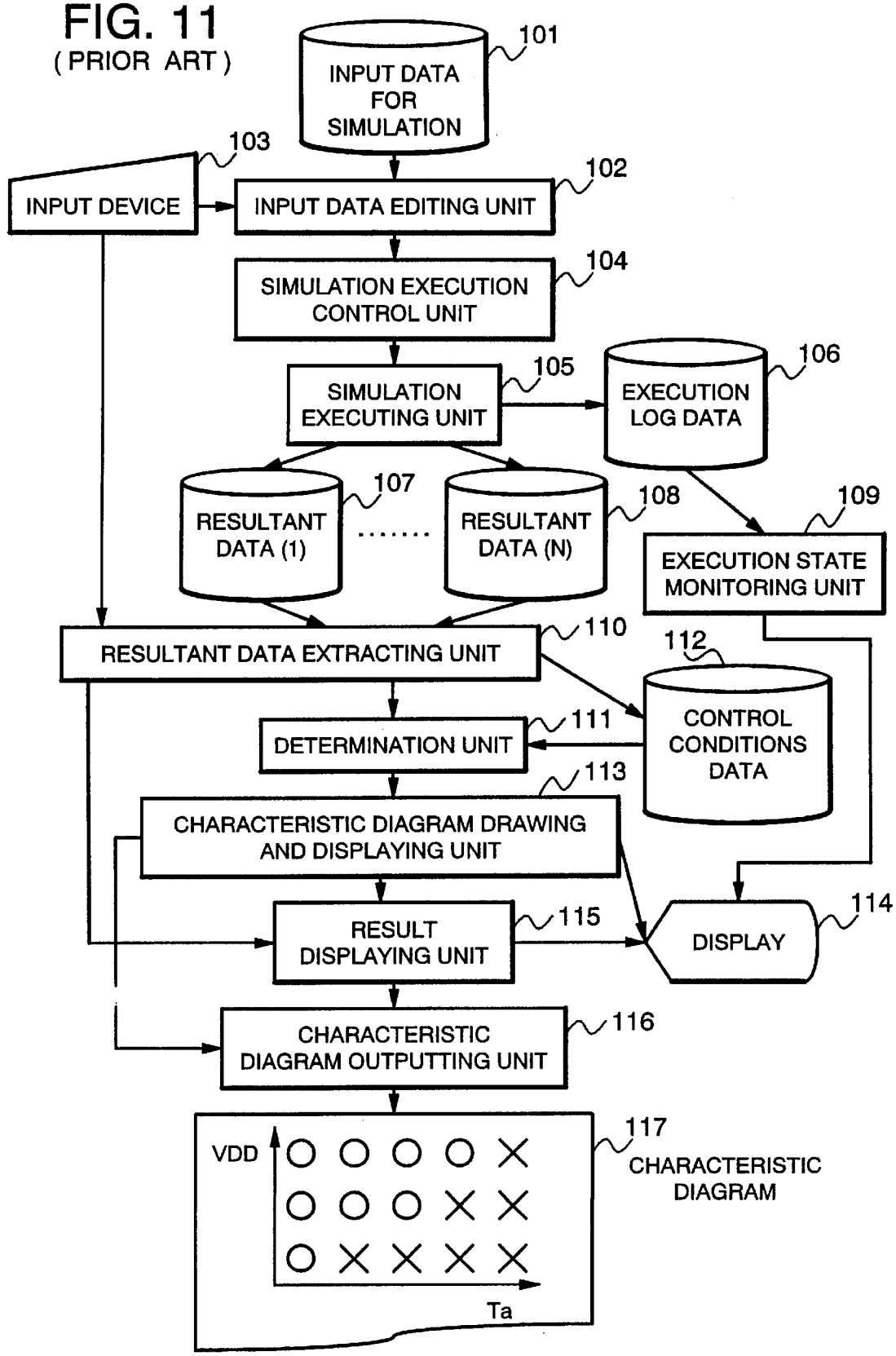
FIG. 11 is a block diagram showing structure of a conventional design support system.
Figure 12:
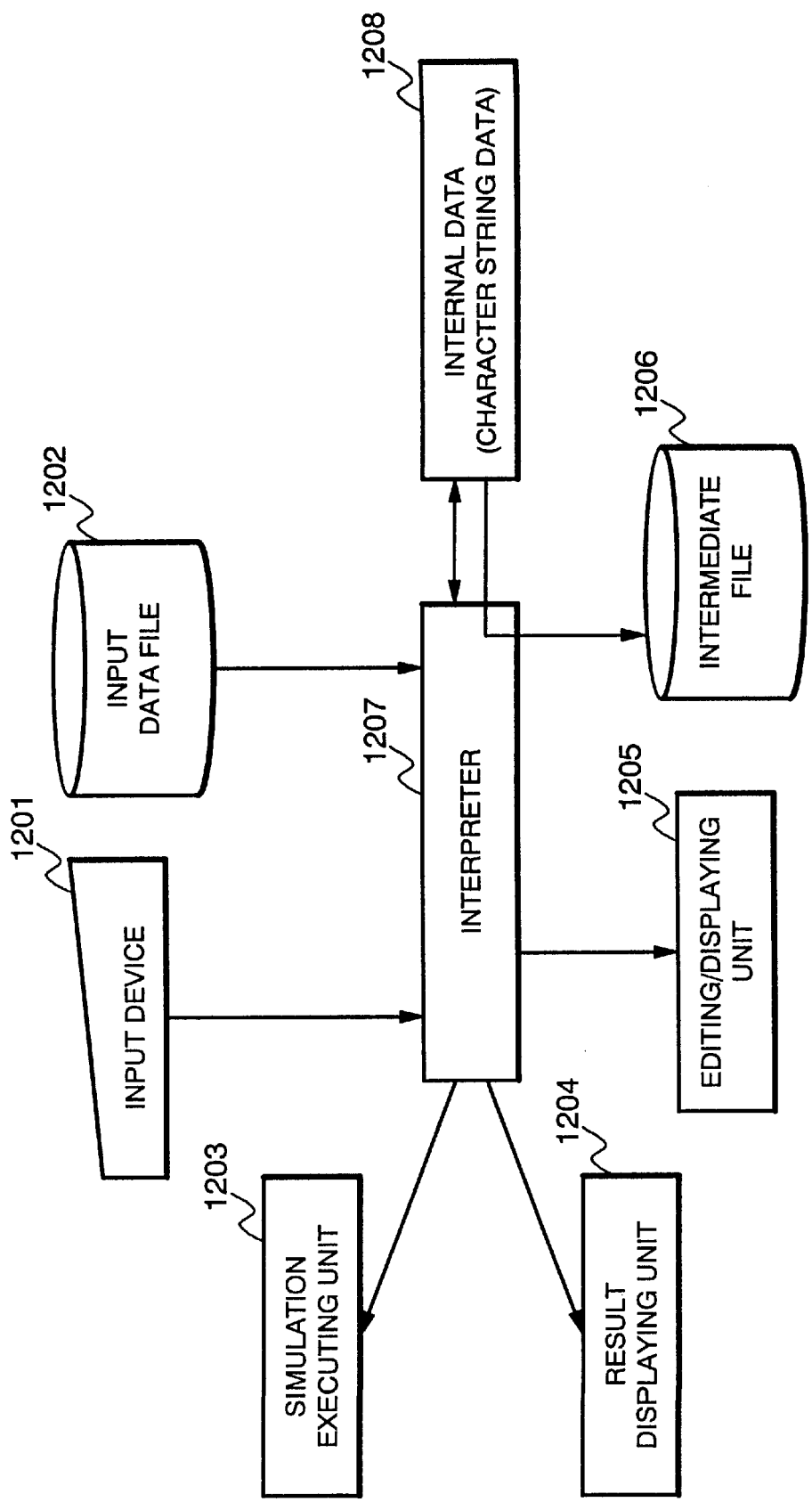
FIG. 12 is a block diagram showing structure of a conventional circuit simulator employed as an interpreter.
Figure 13:
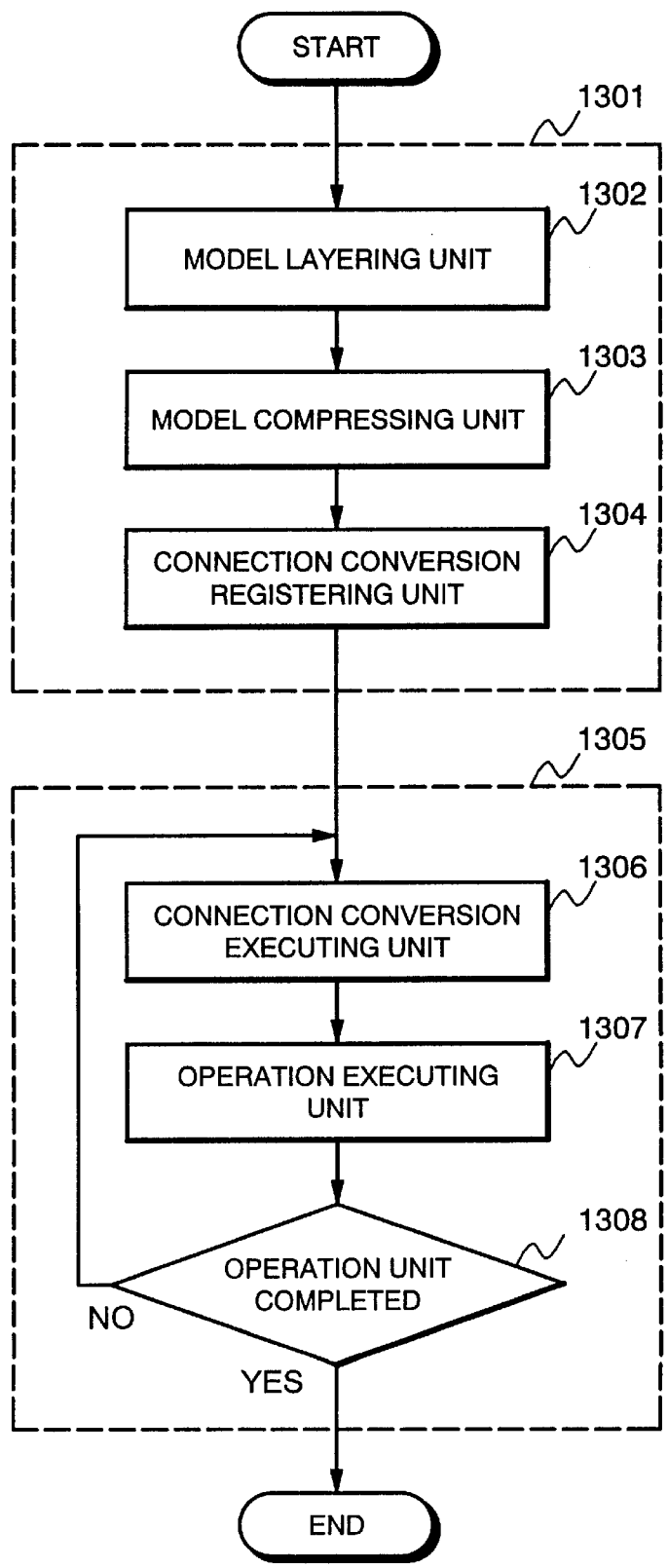
FIG. 13 is a block diagram showing a flow of simulation processing by another conventional design support system.
Figure 15:
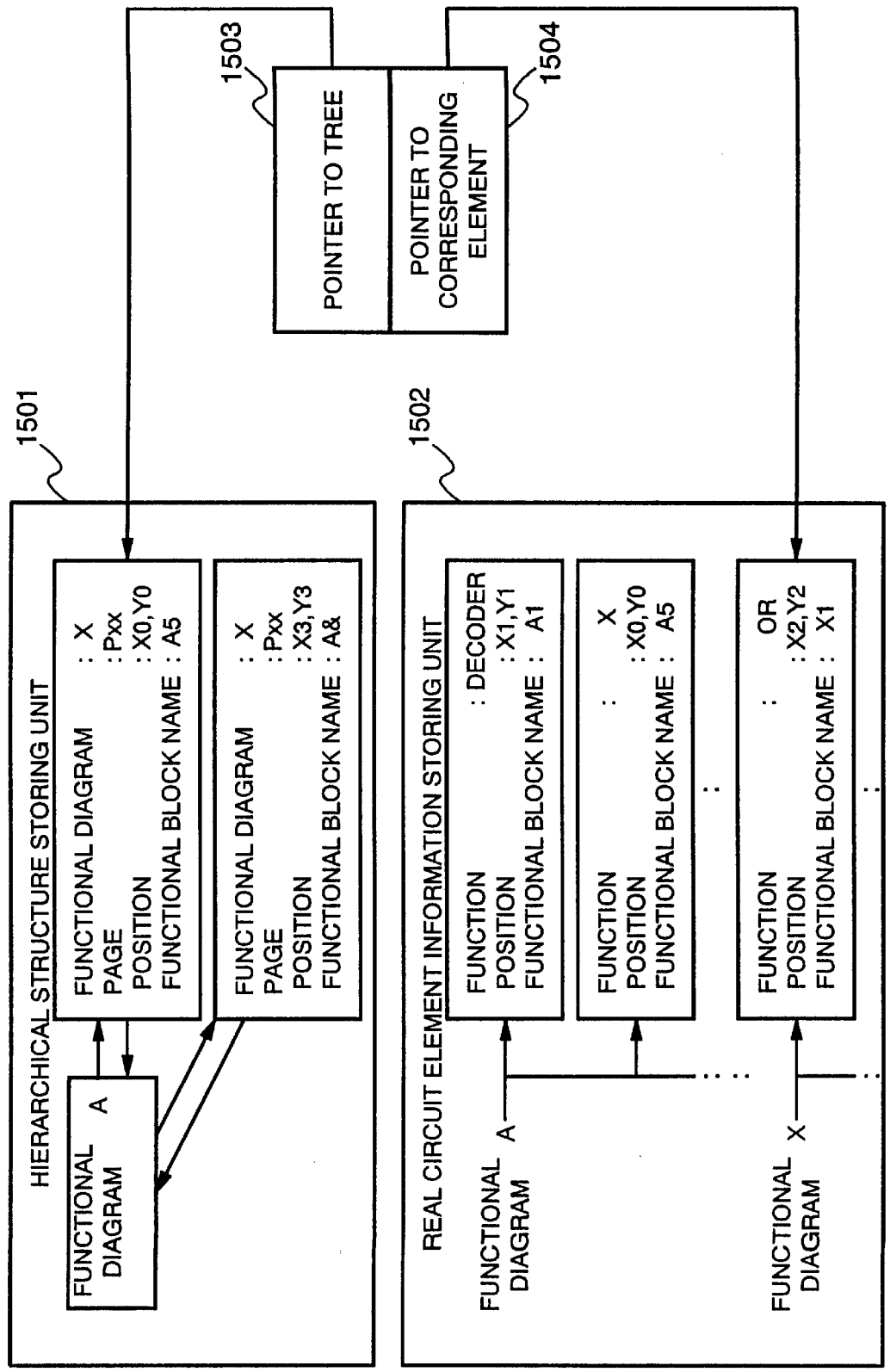
FIG. 15 is a block diagram showing the principle of a data management method by still another conventional design support system.

FIG. 9 is a block diagram showing structure of a circuit simulator formed as an interpreter and a data flow. Illustrated in FIG. 9 are the above-described flow of processing from input data reading to editing and the structured circuit data storing unit 30 implicated by an interpreter.

The circuit simulator shown in FIG. 9 includes an interpreter 90 having a data reading unit 10, a circuit data editing unit 20, a simulation executing device 70 and an output device 80 to analyze and execute a command of the circuit simulator, a structured circuit data storing unit 30, a data file 40, an intermediate file 50, an editor 91 and an input device 60.

In FIG. 9, upon input of a reading command of circuit data for simulation from the input device 60, the interpreter 90 analyzes the command, so that the data reading unit 10 reads the circuit data for simulation stored in the data file 40 to structure and store the circuit data in the structured circuit data storing unit 30. Then, upon input of an execution command of the simulation from the input device 60, the interpreter 90 analyzes the command, so that the simulation executing device 70 executes the simulation. Then, upon input of a display command of a simulation result from the input device 60, the interpreter 90 analyzes the command, so that the output device 80 displays the simulation result as the output.

With reference to the display result output by the output device 80, a user determines whether a target circuit to which the simulation result is related meets the conditions of a desired circuit or not. When the result of the determination finds the necessity of correction, an editing command of input data is applied from the input device 60.

Upon input of the editing command, the interpreter 90 analyzes the editing command, so that the circuit data editing unit 20 extracts a circuit block and an element description designated by the editing command from the data stored in the structured circuit data storing unit 30 and stores the extracted block and element description in the intermediate file 50. The unit 20 then initiates the editor 91 so as to execute editing processing. After the editing processing is completed, the circuit data editing unit 20 also merges the editing contents stored in the intermediate file 50 into the structured circuit data storing unit 30 to reflect the contents. Repetition of the foregoing operation results in obtaining circuit data meeting desired conditions.

As described in the foregoing, since the design support system of the present invention structures and manages circuit data for simulation on a circuit block basis and on a basis of a description in the circuit block, the system enables extraction of a part of circuit blocks and description data with ease. This facilitates partial editing processing in circuit simulation to reduce correction errors during editing processing.

Moreover, even with a large-scale circuit which exceeds the capacity of editing by an editor, editing processing conducted on a circuit block basis makes editing of circuit data possible.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A design support system for generating constituent data of a circuit to be designed by circuit simulation in circuit designing, comprising:

data reading means for reading circuit data for simulation of a circuit to be designed and for analyzing and structuring the circuit data to output structured circuit data;

structured circuit data storing means for storing said structured circuit data outout from aid data reading means; and circuit data editing means for extracting and editing partial data to be edited from said structured circuit data stored in said structured circuit data storing means and for merging edited partial data into said structured circuit data stored in said structured circuit data storing means, wherein said data reading means comprises:

words and phrases/syntax analyzing means for reading said circuit data for simulation and analyzing words and phrases and syntaxes of the circuit data to store analysis results in a form of a hierarchical structure in said structured circuit data storing means, and hierarchical link means for analyzing the hierarchical structure of the circuit data stored in said structured circuit data storing means and based on a result of the analysis, adding a hierarchical relationship link pointer indicative of said hierarchical structure of each said edited partial data to the circuit data stored in said structured circuit data storing means and linking the link pointers.

2. The design support system as set forth in claim 1, wherein said data reading means further comprises:

words and phrases/syntax analyzing means for reading said circuit data for simulation and analyzing words and phrases and syntaxes of circuit data to store analysis results in a form of a hierarchical structure in said structured circuit data storing means, and hierarchical link means for analyzing the hierarchical structure of the circuit data stored in said structured circuit data storing means and based on a result of the analysis, adding a hierarchical relationship link pointer indicative of said hierarchical structure of each said edited partial data to the circuit data stored in said structured circuit data storing means and linking the link pointers, and said circuit data editing means comprising:

circuit block/description searching means for searching and extracting one of: (1) a circuit block to be edited and (2) description data contained in the circuit block from the structured circuit data stored in said structured circuit data storing means, intermediate file outputting means for reading the part of the data extracted by said circuit block/description searching means from said structured circuit data storing means to output the data as an intermediate file, editing executing means for executing desired editing processing with respect to the data of said intermediate file output from said intermediate file outputting means to add editing results to said intermediate file, and editing contents merging means for merging, based on the data of the intermediate file edited by said editing executing means, the intermediate file with the contents of the circuit data stored in said structured circuit data storing means.

3. The design support system as set forth in claim 1, wherein said data reading means further comprises:
words and phrases/syntax analyzing means for reading said circuit data for simulation and analyzing words and phrases and syntaxes of the circuit data to store analysis results in a form of a hierarchical structure in said structured circuit data storing means, and hierarchical link means for analyzing the hierarchical structure of the circuit data stored in said structured circuit data storing means and based on a result of the analysis, adding a hierarchical relationship link pointer indicative of said hierarchical structure of each said edited partial data to the circuit data stored in said structured circuit data storing means and linking the link pointers, and said structured circuit data storing means comprising:
a circuit block table for managing at least one circuit block in the circuit data structured by said words and phrases/syntax analyzing means of said data reading means, a description data table for classifying and managing description data existing in each said at least one circuit block, and a description leading pointer management table for storing and managing a pointer indicative of a leading address of said description data table, and said circuit data editing means comprising:
circuit block/description searching means for searching and extracting one of: (1) a circuit block to be edited and (2) description data contained in the circuit block from the structured circuit data stored in said structured circuit data storing means, intermediate file outputting means for reading the part of the data detected by said circuit block/description searching means from said structured circuit data storing means to output the data as an intermediate file, editing executing means for executing desired editing processing with respect to the data of said intermediate file output from said intermediate file outputting means to add editing results to said intermediate file, and editing contents merging means for merging, based on the data of the intermediate file edited by said editing executing means, the intermediate file with the contents of the circuit data stored in said structured circuit data storing means.

4. A design support system for generating constituent data of a circuit to be designed by circuit simulation in circuit designing, comprising:

data reading means for reading circuit data for simulation of a circuit to be designed and for analyzing and structuring the circuit data to output structured circuit data;

circuit data storing means for storing said structured circuit data output from said data reading means; and circuit data editing means for extracting and editing partial data to be edited from said structured circuit data stored in said structured circuit data storing means and for merging edited partial data into said structured circuit data stored in said structured circuit data storing means, wherein said circuit data editing means comprises:
circuit block/description searching means for searching and extracting one of: (1) a circuit block to be edited and (2) description data contained in the circuit block from the structured circuit data stored in said structured circuit data storing means, intermediate file outputting means for reading the part of the data extracted by said circuit block/description searching means from said structured circuit data storing means to output the data as an intermediate file, editing executing means for executing desired editing processing with respect to the data of said intermediate file output from said intermediate file outputting means to add editing results to said intermediate file, and editing contents merging means for merging, based on the data of the intermediate file edited by said editing executing means, the intermediate file with the contents of the circuit data stored in said structured circuit data storing means.

5. A design support system for generating constituent data of a circuit to be designed by circuit simulation in circuit designing, comprising;

data reading means for reading circuit data for simulation of a circuit to be designed and for analyzing and structuring the circuit data to output structured circuit data;

structured circuit data storing means for storing said structured circuit data output from said data reading means; and circuit data editing means for extracting and editing partial data to be edited from said structured circuit data stored in said structured circuit data storing means and for merging edited partial data into said structured circuit data stored in said structured circuit data storing means, wherein said structured circuit data storing means further comprises:
a circuit block table for managing at least one circuit block in the circuit data structured by said data reading means, a description data table for classifying and managing description data existing in each said at least one circuit block, and a description leading pointer management table for storing and managing a pointer indicative of a leading address of said description data table.

6. The design support system as set forth in claim 5, wherein said structured circuit data storing further comprises:
a circuit block table for managing at least one circuit block in the circuit data structured by said data reading means, a hash table for managing said circuit block table, a description data table for classifying and managing description data existing in each said at least one circuit block, and a description leading pointer management table for storing and managing a pointer indicative of a leading address of said description data table, said circuit block table storing
a circuit block list link pointer for the linkage to other said circuit block tables, and a description leading pointer management table leading pointer indicative of a leading address of said description leading pointer management table, said description data table storing
the circuit description contents in said circuit block of said circuit data, and
a description data table link pointer indicative of one of: (1) a leading address of a subsequent description data table and (2) a hierarchical relationship link pointer indicative of a circuit block table of a lower hierarchy circuit block, and
wherein said hash table managing
the description leading pointer management table leading pointer included in said circuit block table.

7. The design support system as set forth in claim 5, wherein
said structured circuit data storing further comprises:
a circuit block table for managing at least one circuit block in the circuit data structured by said data reading means,
a hash table for managing said circuit block table,
a description data table for classifying and managing description data existing in each said at least one circuit block, and
a description leading pointer management table for storing and managing a pointer indicative of a leading address of said description data table,
said circuit block table storing
a circuit block list link pointer for the linkage to the other said circuit block tables, and
a description leading pointer management table leading pointer indicative of a leading address of said description leading pointer management table, and
said hash table managing
the description leading pointer management table leading pointer included in said circuit block table.

8. The design support system as set forth in claim 5, wherein
said structured circuit data storing means further comprises:
a circuit block table for managing at least one circuit block in the circuit data structured by said data reading means,
a description data table for classifying and managing description data existing in each said at least one circuit block, and
a description leading pointer management table for storing and managing a pointer indicative of a leading address of said description data table,
said circuit block table storing
a circuit block list link pointer for the linkage to other said circuit block tables, and
a description leading pointer management table leading pointer indicative of a leading address of said description leading pointer management table.

9. The design support system as set forth in claim 5, wherein
said structured circuit data storing means further comprises:
a circuit block table for managing at least one circuit block in the circuit data structured by said data reading means,
a description data table for classifying and managing description data existing in each said at least one circuit block, and
a description leading pointer management table for storing and managing a pointer indicative of a leading address of said description data table,
said description data table storing
the circuit description contents in said circuit block of said circuit data, and
a description data table link pointer indicative of one of: (1) a leading address of a subsequent description data table, and (2) a hierarchical relationship link pointer indicative of a circuit block table or a lower hierarchy circuit block.

10. The design support system as set forth in claim 5, wherein
said structured circuit data storing means further comprises:
a circuit block table for managing at least one circuit block in the circuit data structured by said data reading means,
a description data table for classifying and managing description data existing in each said at least one circuit block, and
a description leading pointer management table for storing and managing a pointer indicative of a leading address of said description data table,
said circuit block table storing
a circuit block list link pointer for the linkage to other said circuit block tables, and
a description leading pointer management table leading pointer indicative of a leading address of said description leading pointer management table, and
said description data table storing
the circuit description contents in said circuit block of said circuit data, and
a description data table link pointer indicative of one of: (1) a leading address of a subsequent description data table and (2) a hierarchical relationship link pointer indicative of a circuit block table of a lower hierarchy circuit block.

11. A design support system for generating constituent data of a circuit to be designed by circuit simulation in circuit designing, comprising:
data file storing means for storing circuit data for simulation of a circuit to be designed;
data reading means for reading circuit data for simulation from said data file storing means and analyzing and structuring the circuit data to output structured circuit data;
structured circuit data storing means for storing structured circuit data output by said data reading means;
circuit data editing means for searching, extracting and editing partial data to be edited from structured circuit data stored in said structured circuit data storing means and merging edited partial data into the contents of the structured circuit data stored in said structured circuit data storing means;
wherein said partial data comprises structure and descriptive contents of a portion of said circuit data;
simulation executing means for reading structured circuit data from said structured circuit data storing means to execute simulation; and
output means for outputting a simulation result obtained by said simulation executing means, and wherein
said data reading means further comprises:
words and phrases/syntax analyzing means for reading said circuit data for simulation and analyzing words and phrases and syntaxes of the circuit data to store analysis results in a form of a hierarchical structure in said structured circuit data storing means, and
hierarchical link means for analyzing hierarchical structure of the circuit data stored in said structured circuit data storing means and based a result of the analysis, adding a hierarchical relationship link pointer indicative of said hierarchical structure of each said edited partial data to the circuit data stored in said structured circuit data storing means and linking the link pointers, and said circuit data editing means comprising:

circuit block/description searching means for searching and extracting one of: (1) a circuit block to be edited and (2) description data contained in the circuit block from the structured circuit data stored in said structured circuit data storing means, intermediate file outputting means for reading the part of the data detected by said circuit block/description searching means from said structured circuit data storing means to output the data as an intermediate file, editing executing means for executing desired editing processing with respect to the data of said intermediate file output from said intermediate file outputting means to add editing results to said intermediate file, and editing contents merging means for merging, based on the data of the intermediate file edited by said editing executing means, the intermediate file with the contents of the circuit data stored in said structured circuit data storing means.

12. A design support system generating constituent data of a circuit to be designed by circuit simulation in circuit designing, comprising:

data file storing means for storing circuit data for simulation of a circuit to be designed;

data reading means for reading circuit data for simulation from said data file storing means and analyzing and structuring the circuit data to output structured circuit data;

structured circuit data storing mean for storing structured circuit data output by said data reading means;

circuit data editing means for searching, extracting and editing partial data to be edited from structured circuit data stored in said structured circuit data storing means and merging edited partial data into the contents of the structured circuit data stored in said structured circuit data storing means;

wherein said partial data comprises structure and descriptive contents of a portion of said circuit data;

simulation executing means for reading structured circuit data from said structured circuit data storing means to execute simulation; and output means for outputting a simulation result obtained by said simulation executing means, and wherein said structured circuit data storing means comprises;

a circuit block table for managing at least one circuit block in the circuit data structured by said data reading means, a description data table for classifying and managing description data existing in each said at least one circuit block, and a description leading pointer management table for storing and managing a pointer indicative of a leading address of said description data table.

13. The design support system as set forth in claim 12, wherein said structured circuit data storing means further comprises:

a circuit block table for managing at least one circuit block in the circuit data structured by said data reading means, a description data table for classifying and managing description data existing in each said at least one circuit block, and a description leading pointer management table for storing and managing a pointer indicative of a leading address of said description data table, wherein said circuit block table storing a circuit block list link pointer for the linkage to other said circuit block tables, and a description leading pointer management table leading pointer indicative of a leading address of said description leading pointer management table, and wherein said description data table storing the circuit description contents in said circuit block of said circuit data, and a description data table link pointer indicative of one of: (1) a leading address of a subsequent description data table and (2) a hierarchical relationship link pointer indicative of a circuit block table of a lower hierarchy circuit block.

14. The design support system as set forth in claim 12, wherein said structured circuit data storing means further comprises:

a circuit block table for managing at least one circuit block in the circuit data structured by said data reading means, a hash table for managing said circuit block table, a description data table for classifying and managing description data existing in each said at least one circuit block, and a description leading pointer management table for storing and managing a pointer indicative of a leading address of said description data table, wherein said circuit block table storing a circuit block list link pointer for the linkage to other said circuit block tables, and a description leading pointer management table leading pointer indicative of a leading address of said description leading pointer management table, and said hash table managing the description leading pointer management table leading pointer included in said circuit block table.

* * * * *

UNITED STATES PATENT AND TRADEMARK OFFICE
CERTIFICATE OF CORRECTION

PATENT NO. : 6,068663
DATED : May 30, 2000
INVENTOR(S) : T. Ura

It is certified that error appears in the above-identified patent and that said Letters Patent are hereby corrected as shown below:

Column 16, Line 10, Claim 1: "outout" should read --output--

Column 16, Line 10, Claim 1: "aid" should read --said--

Column 17, Line 59, Claim 4: "circuit" should read --structured circuit--

Column 19, Line 25, Claim 7: "said" should read --wherein said--

Column 21, Line 26, Claim 12: "circuit" should read --by circuit--

Signed and Sealed this

Twenty-second Day of May, 2001

*Attest:*

NICHOLAS P. GODICI

*Attesting Officer*  *Acting Director of the United States Patent and Trademark Office*